(12) United States Patent
Asa

(10) Patent No.: US 6,771,155 B2
(45) Date of Patent: Aug. 3, 2004

(54) COMPACT MAGNETIC INDUCTION SWITCH

(75) Inventor: Yukihiro Asa, Tokyo (JP)

(73) Assignee: ASA Electronic Industry Co., Ltd., Tokyo (JP)

(*) Notice: Subject to any disclaimer, the term of this patent is extended or adjusted under 35 U.S.C. 154(b) by 18 days.

(21) Appl. No.: 10/246,598

(22) Filed: Sep. 18, 2002

(65) Prior Publication Data

US 2003/0085785 A1 May 8, 2003

(30) Foreign Application Priority Data

Nov. 8, 2001 (JP) ........................................ 2001-343194

(51) Int. Cl.[7] ................................................ H01H 9/00
(52) U.S. Cl. ........................................................ 335/205
(58) Field of Search ................................. 335/205–208

(56) References Cited

U.S. PATENT DOCUMENTS 3,673,526 A * 6/1972 Brevick ...................... 335/205
4,346,360 A * 8/1982 Del Tufo ..................... 335/205
5,656,982 A * 8/1997 Kurahara

* cited by examiner

Primary Examiner—Ramon M. Barrera
(74) Attorney, Agent, or Firm—Kirk D. Wong; Hickman Palermo Truong & Becker LLP

(57) ABSTRACT

An ultra compact low cost magnetic induction switch which manages with an extremely small operation force has an movable member and a coil spring arranged inside a switch case, the spring coil supporting the movable member and the movable member protruding from an opening of an upper surface portion of the switch case. A hole IC is arranged in a switch case.

When the upper portion is pushed, a magnet fixed to the movable member moves downward so that an output signal of a hole is changed from OFF to ON.

13 Claims, 8 Drawing Sheets

COMPACT MAGNETIC INDUCTION SWITCH

BACKGROUND OF THE INVENTION

1. Field of the Invention

The present invention relates to a non-contact type compact magnetic induction switch capable of being ON and OFF by a slight operating force.

2. Description of the Related Art

As for a conventional compact switch, there are available a mechanical contact type switch and a proximity switch utilizing an oscillator. However, the contact type switch has its limit in making the operating force small, and further miniaturization thereof is difficult. While, the proximity switch is complicated in its structure, and has its limit in reducing the cost.

Further, a hole effect type position sensor which combines a permanent magnet and a hole element is used as position detection means for various types of equipment. This position sensor attaches the permanent magnet to a detected body whose position is desired to be detected so that magnetic field generating portions are constituted and, at the same time, a magnetic detection portion comprising the hole element is constituted so as to be relatively displaced against these magnetic field generating portions. When the magnetic field generating portions come close to the magnetic field detection portion, the hole element of the magnetic field detection portion detects the magnetic field from the magnetic generating portions by means of the hole effect and outputs an electrical signal, thereby detecting the position of the detected body. The hole effect type position sensor which constitutes such a hole element as the magnetic field detection portion does not have a mechanical contact such as a micro switch and the like, and has the advantages of being highly reliable in operating in non-contact on the detected body and, hence, is adopted in a wide range of applications.

Since the object of the sensor is to detect the position, though a measure for improving position detection accuracy is taken, using the sensor as a compact switch is not taken into consideration. Therefore, improving the function of the sensor as the compact switch is not taken at all.

SUMMARY OF THE INVENTION

The object of the present invention is to provide an ultra compact magnetic induction switch, whose operating force is made as small as possible and whose size is made as compact as possible.

In order to achieve the above-described object, the compact magnetic induction switch comprises: a switch case; a movable member provided inside the switch case; an elastic body which is installed inside the switch case and urges an end portion of the movable member so as to protrude it outside of the switch case; a hole IC arranged adjacent to the movable member inside the case; and a magnet fixed to the movable member, wherein the magnet is constituted so as to be moved so that an output of the hole IC is put into an OFF or ON state at non-pressing time of the end portion of the movable member and the output of the hole IC is put into an ON or OFF state at pressing time of the end portion of the movable member.

Additionally, the above-described object is realized by the compact magnetic induction switch comprising: a switch case; a movable member provided on an opening of the switch case and being reciprocally movable; an elastic body which is installed inside the switch case and urges an end portion of the movable member so as to be protruded outside of the switch case; a magnet fixed to the movable member; and a hole IC for detecting change of magnetic field caused by movement of the movable member with its operating point, wherein if the magnet field applied to the operating point of the hole IC becomes above or below a threshold by movement of the movable member, output signal of the hole IC switches on/off.

In the compact magnetic induction switch of the present invention, the positioning portion which positions the hole IC at a predetermined position may be provided inside the switch case.

Alternatively, a guide portion which guides the movable member may be provided inside the switch case. A lid member which is fitted into the bottom of the switch case may be provided and an opening which derives the lead wire of the hole IC or an opening which injects a filling agent may be provided on the lid member.

DESCRIPTION OF THE PREFERRED EMBODIMENT

Figure 1:
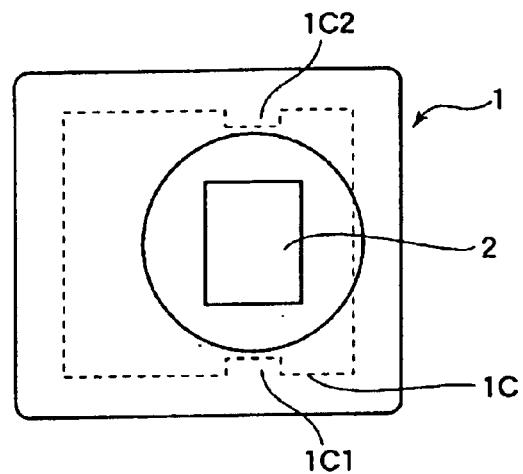
FIG. 1 is a plan view of one embodiment of a switch of the present invention.

One embodiment of a compact magnetic induction switch of the present invention is shown in FIGS. 1 to 8. In the drawings, reference numeral 1 denotes a switch case, reference numeral 2 a movable member, reference numeral 3 a spring coil, reference numeral 4 a hole IC, reference numeral 5 an output lead wire thereof and reference numeral 6 a permanent magnet, for example, such as a rare earth magnet.

The switch case 1, as shown in FIGS. 2 to 8, has a chamber 1a, in the interior of which are stored the movable member 2, the spring 3 and the hole IC 4. In the chamber 1a, there are a positioning portion 1b and a guide portion 1c integrally provided with the switch case, and the positioning portion 1b comprises three pieces of positioning portions 1b1 to 1b3. The guide portion 1c has rail-shaped guide members 1c1, 1c2 which protrude inward longitudinally inside the interior. Further, on the upper surface portion of the switch case 1 is provided an opening 1D, and on the bottom thereof is built-in a base 1E. In the base 1E is provided a storing concave portion 1F of the spring 3 and a deriving hole 1G of the output lead wire 5.

Figure 2:
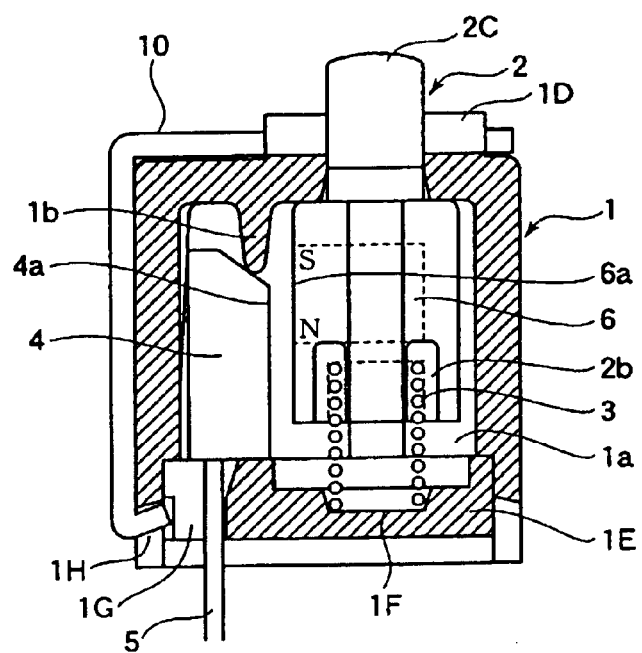
FIG. 2 is a front sectional view of the embodiment.
Figure 3:
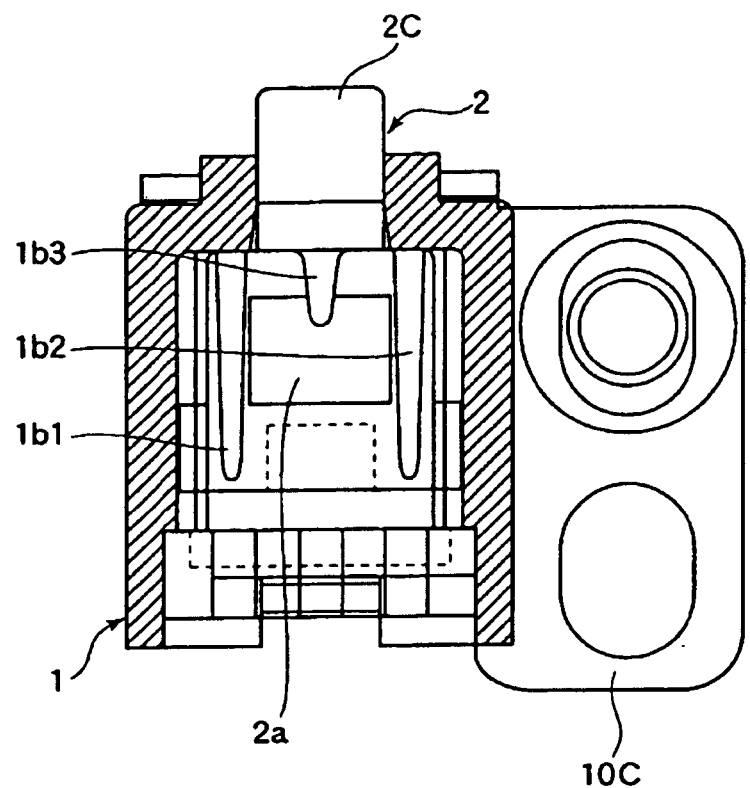
FIG. 3 is a side sectional view of the embodiment.
Figure 4:
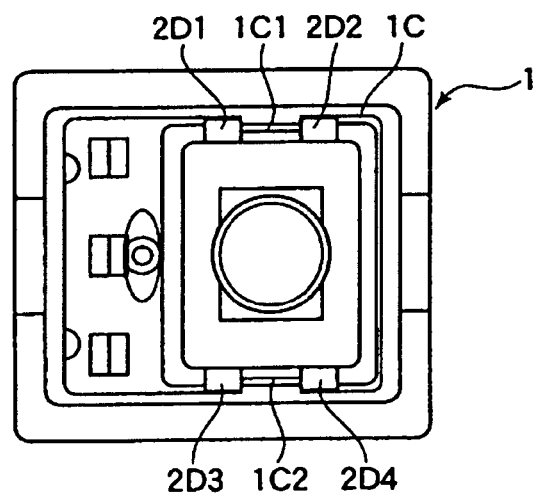
FIG. 4 is a bottom view of the embodiment.
Figure 5:
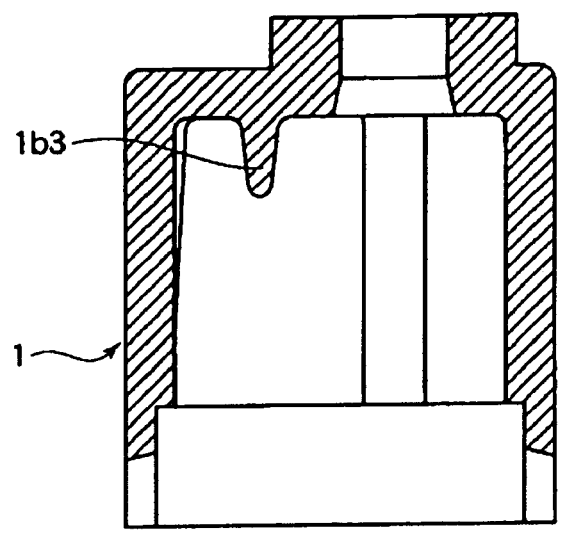
FIG. 5 is a front sectional view of a switch case in the embodiment.
Figure 6:
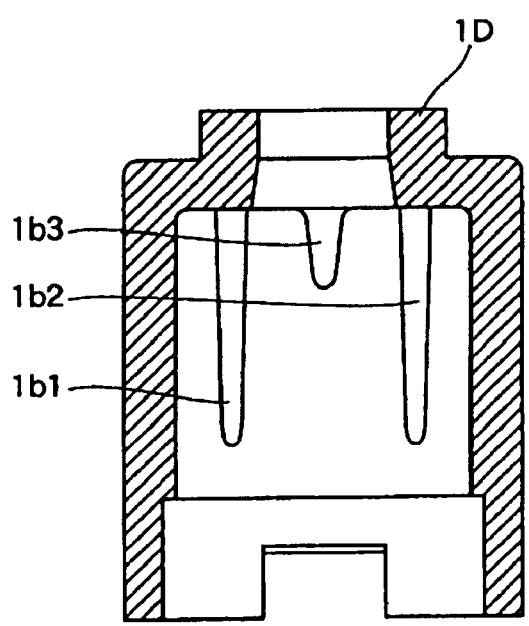
FIG. 6 is a side sectional view of the switch case.
Figure 7:
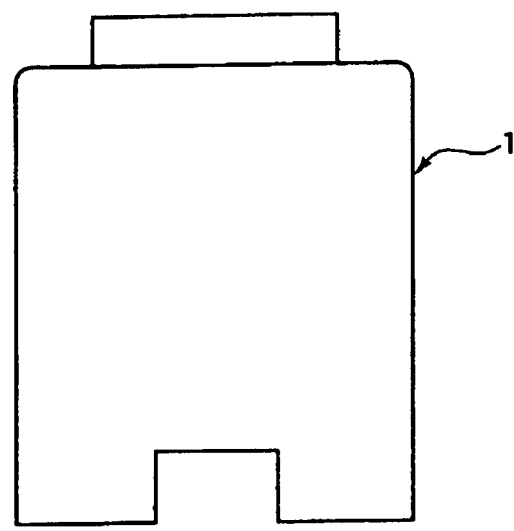
FIG. 7 is a side view of the switch case.
Figure 8:
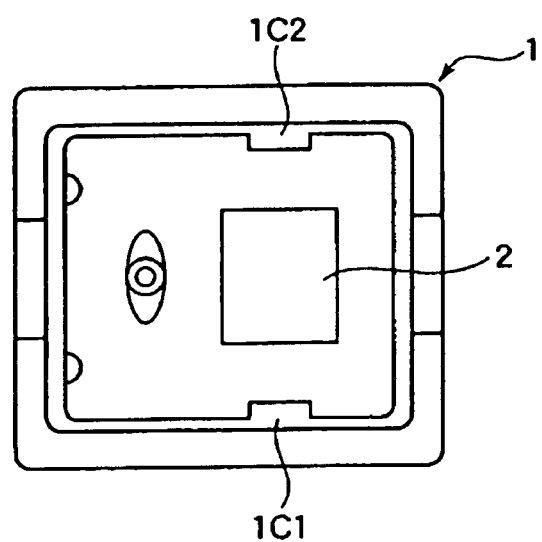
FIG. 8 is a bottom view of the switch case.

The movable member 2, as shown in FIGS. 2, 3, has a concave portion 2a to fix the magnet 6 and an upper storing chamber 2b of the spring 3. The magnet 6 is fixed to the concave portion 2a by an adhesive agent and the like.

The movable member 2, as shown in FIGS. 1 to 4, is stored inside the chamber 1a inside the switch case 1, and the upper portion of the spring 3 stored in the concave portion IF is inserted into the interior of the storing chamber 2b so as to support the movable member 2, and in this state, an upper end portion 2c of the movable member 2 protrudes from an opening 1D of the upper surface portion of the switch case 1. An upper portion of the movable member 2 contacts an upper area of chamber 1a of switch case 1 to retain the movable member 2 in switch case 1.

Further, in the left and right sides of the movable member 2 are formed protruding portions 2D1 to 2D4, and these protruding portions are fitted to the guide members 1c1, 1c2 of the guide portion 1c with a little clearance.

The hole IC 4 is positioned by the positioning-members 1b1 to 1b3 of the positioning portion 1b in the chamber 1a inside the switch case 1, and is mounted on the base 1E. The output lead wire 5 from the hole IC 4 is derived to the outside via the deriving hole 1G.

Due to the above-described constitution, the movable member 2 in a state of not pressing the upper end portion 2c is supported by a repelling force of the spring 3, and the upper end portion 2c protrudes from the opening 1D. At this time, a magnetic neutral point 6a of the magnet 6 is slightly above an operating point 4a of the hole IC 4. An output signal obtained in this state from the output lead wire 5 of the hole IC 4 is in an OFF state.

Next, when the upper end portion 2c is pressed, the movable member 2 moves downward, and the neutral point 6a of the magnet 6 passes through the operating point 4a of the hole IC 4, and at that point in time, the output signal is turned ON. By pressing or non-pressing the upper end portion 2c in this way, the output signal of the hole IC 4 can be turned On or OFF (or OFF or ON).

Figure 9:
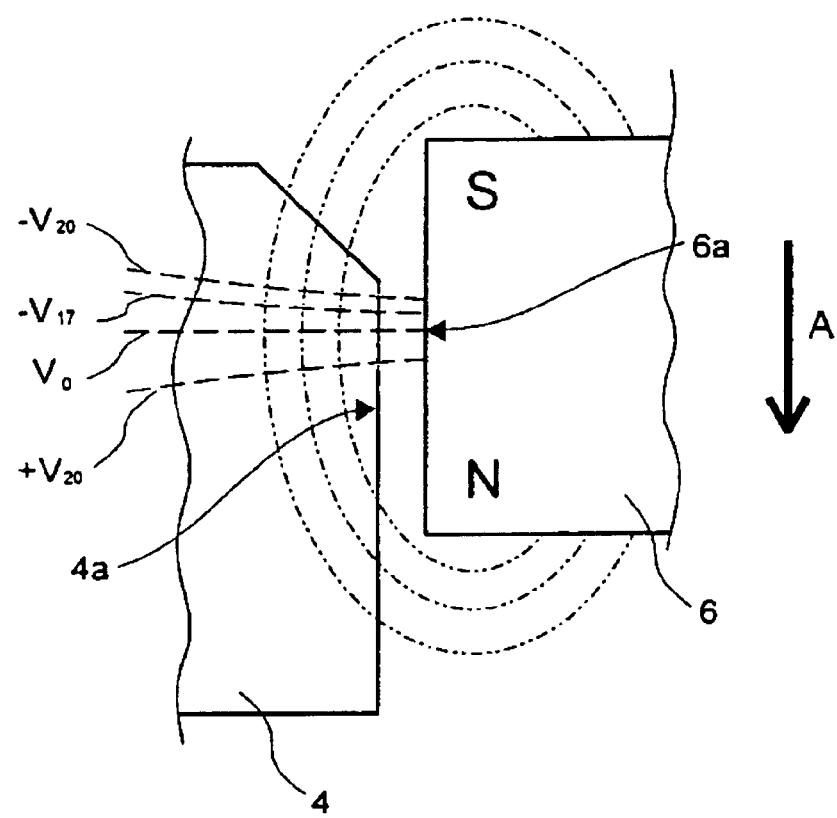
FIG. 9 shows the operation principle of the inventive switch.

Referring to FIG. 9, the switch of the invention can be activated by an operating force of only one (1) gram. The movable member 2 is in the upper position where the upper end portion 2c is not pushed. In this configuration, the operating point 4a of the hole IC 4 is just under the N-pole side isomagnetic field plane $+V_{20}$ of 20 Gauss, while the magnetic neutral point 6a of the magnet 6 is located above the plane $+V_{20}$. Isomagnetic field plane $V_0$ in which the magnetic field is zero (0) is orthogonal against the surface of the magnet 6 at the neutral point 6a.

The upper end portion 2c is then pushed, and the magnet 6 moves downward in the direction shown by an arrow A. When the S-pole isomagnetic field plane $-V_{20}$ of 20 Gauss passes through the operating paint 4a, the hole IC 4 outputs ON signal because its threshold from OFF state to ON state is set to magnetic field corresponding to the plane $-V_{20}$. The magnetic field is higher than 20 Gauss while the upper end portion 2c is pushed, so that the ON signal is sustained.

When the upper end portion 2c goes back to the original position, the magnetic neutral point 6a moves upward. At the moment the S-pole isomagnetic field plane $-V_{17}$ of 17 Gauss passes through the operating point 4a, the ON state of the hole IC 4 changes to OFF state because its threshold from ON state to OFF state is set to the magnetic field corresponding to the plane $-V_{17}$. Setting two kinds of thresholds like $-V_{20}$ and $-V_{17}$ prohibits self-oscillation of the hole IC.

As described above, in order to activate the switch of the invention, it is only necessary to apply a magnetic field corresponding to the threshold of the hole IC 4 to the operating point 4a, which needs little operating force, only one (1) g, because the hole IC is not attracted by the magnet. In contrast, in case of a conventional switch employing the combination of a reed switch and a magnet, the reed switch is attracted by the magnet, so that it can not be switched by such a small force. Furthermore, in the switch of the invention, the distance necessary for switching on is only several μm, but in the conventional switch employing the combination of the reed switch and the magnet, such distance is several mm.

Figure 10:
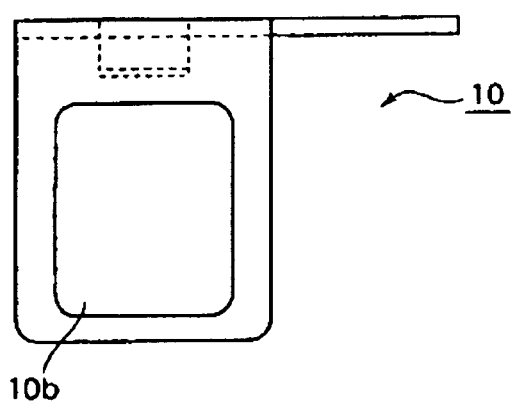
FIG. 10 is a plan view of a mounting bracket to be used to mount the switch of the invention.
Figure 11:
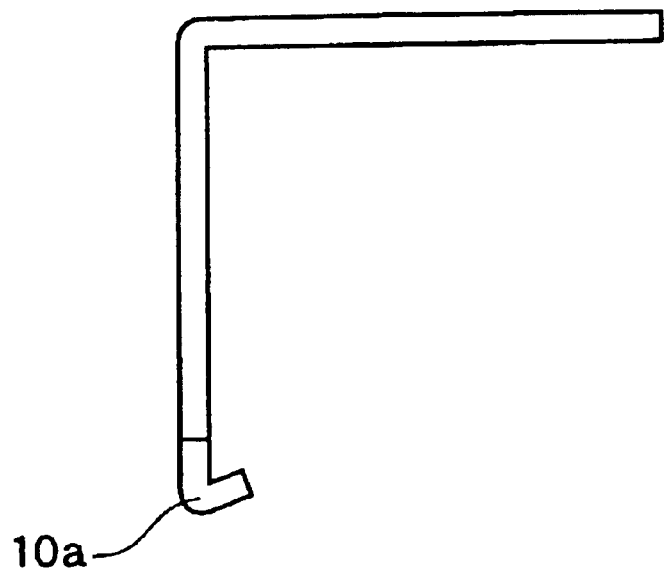
FIG. 11 is a side view of the mounting bracket.
Figure 12:
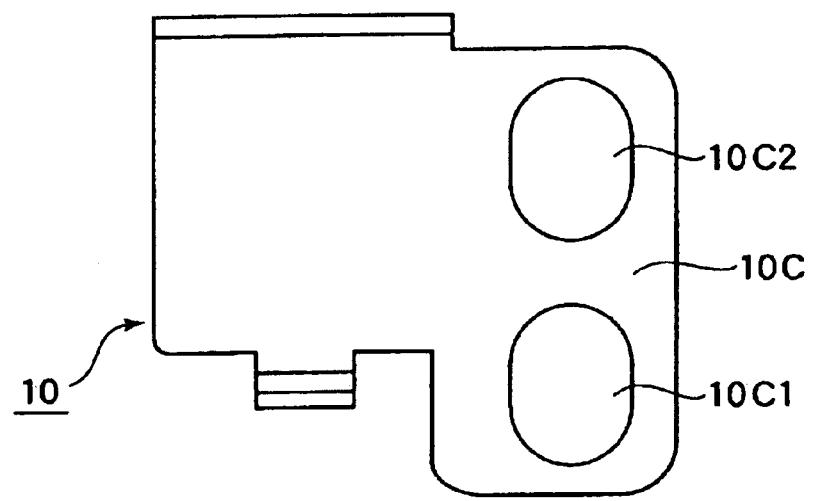
FIG. 12 is a front view of the mounting bracket.

FIGS. 10 to 12 show one example of a mounting bracket to mount the switch of the invention on a desired member as occasion demands. In the drawings, reference numeral 10 denotes a mounting bracket, reference numeral 10a an engaging portion, reference numeral 10b a case mounting opening portion and reference numeral 10c a mounting portion.

As shown in FIGS. 2, 3, the engaging portion 10a of the mounting bracket 10 is engaged with an engaging hole 1H of the switch case 1, and the opening portion 10b is fitted to the opening 1D of the switch case 1. Mounting holes 10c1, 10c2 of the mounting portion 10c are used for screw clamp to the desired member.

Figure 13:
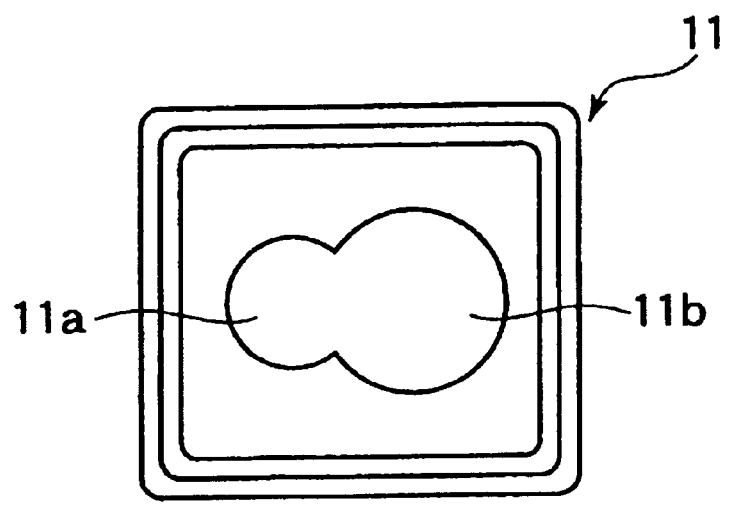
FIG. 13 is a plan view of a lid member to be used to seal the switch of the invention.
Figure 14:
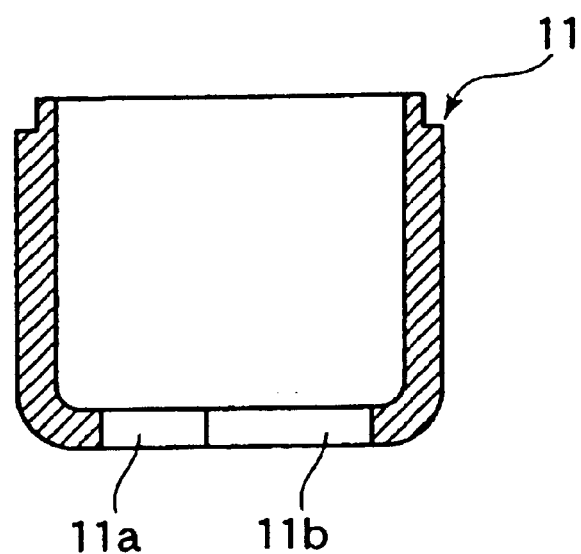
FIG. 14 is a front sectional view of the lid member.
Figure 15:
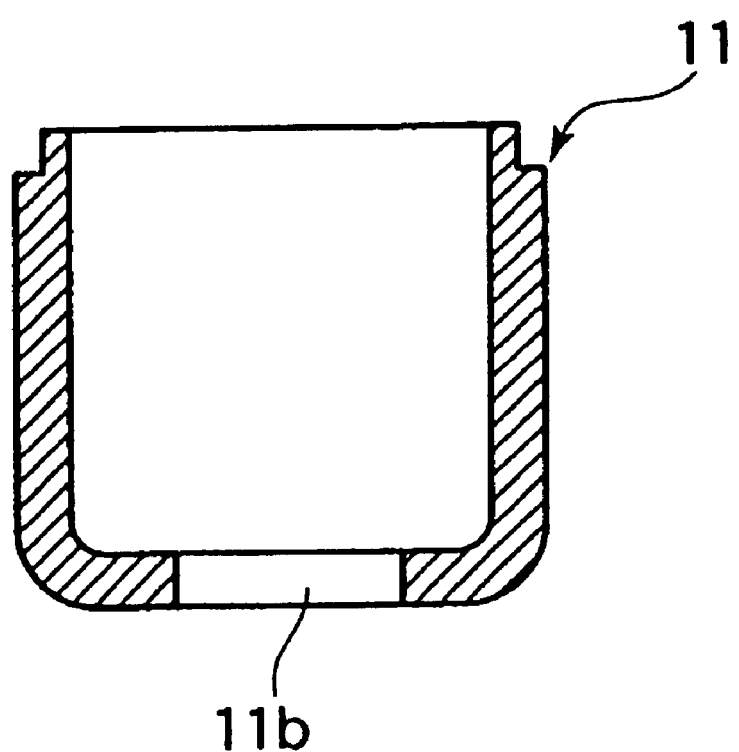
FIG. 15 is a side sectional view of the lid member.

FIGS. 13 to 15 show a lid member 11 to be fitted to the bottom of the switch case 1 as occasion demands and seal the bottom of the switch. In the drawings, reference numeral 11a denotes a take out hole of the output lead wire 5 and reference numeral 11b denotes a hole to inject a filling agent such as silicon resin and the like. The lid member 11 is fitted to the bottom of the switch case 1, and after taking out the output lead wire 5 from the take out hole 11a, injects silicon resin into the take out hole from the hole 11b and seals the hole.

As described above, according to the invention, an ultra compact magnetic induction switch can be constituted operable with a small operating force of about one gram level. Further, since members other than the hole IC, the magnet and the spring can be formed by synthetic resin, a sharp reduction in costs can be attempted. Further, as an output of the hole IC, a switch output of OFF-ON or ON-OFF can be easily obtained.

What is claimed is:

1. A magnetic switch, comprising:
    a switch case defining a chamber and including positioning portions and guide portions;
    a movable member provided inside the chamber, said movable member including a storing chamber and protruding portions, the protruding portions coacting with said guide portions so that said movable member is movable in a linear direction;
    a base member closing one end of said switch case and including a concave portion opening into said chamber;
    a spring element provided inside the chamber and having a first end positioned in the storing chamber of said movable member and a second end positioned in the concave portion of said base member, the spring element applying a biasing to said movable member so that an end portion of said movable member projects outwardly of said switch case;
    a magnet secured to said movable member;
    a hole IC arranged within said switch case by said positioning portions in the vicinity of said movable member for sensing the position of said magnet,
    wherein, when the end portion of said movable member projects outwardly of said switch case the combination of the magnet and the hole IC outputs one of an OFF signal or an ON signal for the magnetic switch, and when the end portion of said movable member is depressed, the change in position of the magnet relative to the hole IC changes the output from the magnetic switch to the other one of an OFF signal and an ON signal; and wherein said end portion of said movable member extends from and is integral with part of a top end section of said movable member so that part of said top end section of said movable member contacts the switch case to retain said movable member in said switch case when said end portion projects outwardly of said switch case.

2. The magnetic switch of claim 1, wherein said switch case, said movable member and said base member comprise a synthetic resin.

3. The magnetic switch of claim 1, wherein said guide portions comprise rail-shaped guide members and said protruding portions are fitted to said guide members to enable linear movement of said movable member.

4. The magnetic switch of claim 1, said switch case including a deriving hole providing a path for an output wire connected to said hole IC.

5. The magnetic switch of claim 4, including a lid member for fitting to a bottom of said switch case, said lid member including a take out hole providing a path through said lid member for said output wire and an injection hole.

6. The magnetic switch of claim 5, including silicon resin injected through said injection hole, said silicon resin sealing the bottom of said switch case.

7. The magnetic switch of claim 1, wherein said switch case includes an engaging hole.

8. The magnetic switch of claim 7, including a mounting bracket for mounting said switch to a desired member, said mounting bracket including a first side including an engaging portion for engagement with said engaging hole and said mounting bracket including a second side having an opening portion for receiving the end portion of said movable member projecting outwardly of said switch case.

9. The magnetic switch of claim 1, wherein when the end portion of said movable member projects outwardly of said switch case the hole IC outputs an OFF signal and when the end portion of said movable member is depressed and moves inwardly the hole IC outputs an ON signal.

10. The magnetic switch of claim 9, wherein an operating force of about one gram depresses said movable member and outputs an ON signal.

11. The magnetic switch of claim 1, wherein when the end portion of said movable member projects outwardly of said switch case the hole IC outputs an ON signal and when the end portion of said movable member is depressed and moves inwardly the hole IC outputs an OFF signal.

12. The magnetic switch of claim 11, wherein an operating force of about one grain depresses said movable member and outputs an OFF signal.

13. The magnetic switch of claim 1, wherein said magnet comprises a permanent magnet.

* * * * *

UNITED STATES PATENT AND TRADEMARK OFFICE
CERTIFICATE OF CORRECTION

PATENT NO. : 6,771,155 B2
DATED : August 3, 2004
INVENTOR(S) : Yukihiro Asa

It is certified that error appears in the above-identified patent and that said Letters Patent is hereby corrected as shown below:

Column 6,
Line 24, replace "grain" with -- gram --.

Signed and Sealed this

Eighteenth Day of January, 2005

JON W. DUDAS
*Director of the United States Patent and Trademark Office*

UNITED STATES PATENT AND TRADEMARK OFFICE
CERTIFICATE OF CORRECTION

PATENT NO. : 6,771,155 B2
APPLICATION NO. : 10/246598
DATED : August 3, 2004
INVENTOR(S) : Yukihiro Asa It is certified that error appears in the above-identified patent and that said Letters Patent is hereby corrected as shown below:

On the Title Page

In the Abstract:

Item (57), line 6, replace "hole" with --Hall--.

Column 1, line 19, replace "hole" with --Hall--.

Column 1, line 29, replace "hole" with --Hall--.

Column 1, line 33, replace "hole" with --Hall--.

Column 1, line 34, replace "hole" with --Hall--.

Column 1, line 56, replace "hole" with --Hall--.

Column 1, line 59, replace "hole" with --Hall--.

Column 1, line 61, replace "hole" with --Hall--.

Column 2, line 4, replace "hole" with --Hall--.

Column 2, line 7, replace "hole" with --Hall--.

Column 2, line 8, replace "hole" with --Hall--.

Column 2, line 11, replace "hole" with --Hall--.

Column 2, line 18, replace "hole" with --Hall--.

Column 2, line 52, replace "hole" with --Hall--.

Column 2, line 57, replace "hole" with --Hall--.

Column 3, line 19, replace "hole" with --Hall--.

Column 3, line 22, replace "hole" with --Hall--.

UNITED STATES PATENT AND TRADEMARK OFFICE
CERTIFICATE OF CORRECTION

PATENT NO.         : 6,771,155 B2
APPLICATION NO. : 10/246598
DATED                 : August 3, 2004
INVENTOR(S)       : Yukihiro Asa It is certified that error appears in the above-identified patent and that said Letters Patent is hereby corrected as shown below:

Column 3, line 29, replace "hole" with --Hall--.

Column 3, line 31, replace "hole" with --Hall--.

Column 3, line 35, replace "hole" with --Hall--.

Column 3, line 37, replace "hole" with --Hall--.

Column 3, line 43, replace "hole" with --Hall--.

Column 3, line 52, replace "hole" with --Hall--.

Column 3, line 61, replace "hole" with --Hall--.

Column 3, line 65, replace "hole" with --Hall--.

Column 4, line 1, replace "hole" with --Hall--.

Column 4, line 3, replace "hole" with --Hall--.

Column 4, line 38, replace "hole" with --Hall--.

Column 4, line 41, replace "hole" with --Hall--.

Claim 1, column 4, line 62, replace "hole" with --Hall--.

Claim 1, column 5, line 1, replace "hole" with --Hall--.

Claim 1, column 5, line 5, replace "hole" with --Hall--.

Claim 4, column 5, line 24, replace "hole" with --Hall--.

Claim 9, column 6, line 12, replace "hole" with --Hall--.

UNITED STATES PATENT AND TRADEMARK OFFICE
CERTIFICATE OF CORRECTION

PATENT NO. : 6,771,155 B2
APPLICATION NO. : 10/246598
DATED : August 3, 2004
INVENTOR(S) : Yukihiro Asa It is certified that error appears in the above-identified patent and that said Letters Patent is hereby corrected as shown below:

Claim 9, column 6, line 14, replace "hole" with --Hall--.

Claim 9, column 6, line 20, replace "hole" with --Hall--.

Claim 9, column 6, line 22, replace "hole" with --Hall--.

Signed and Sealed this

First Day of January, 2008

JON W. DUDAS
*Director of the United States Patent and Trademark Office*

UNITED STATES PATENT AND TRADEMARK OFFICE
CERTIFICATE OF CORRECTION

PATENT NO. : 6,771,155 B2
APPLICATION NO. : 10/246598
DATED : August 3, 2004
INVENTOR(S) : Yukihiro Asa It is certified that error appears in the above-identified patent and that said Letters Patent is hereby corrected as shown below:

On The Title Page,

In the Abstract:

Item (57), line 6, replace "hole" with --Hall--.

Column 1, line 19, replace "hole" with --Hall--.

Column 1, line 29, replace "hole" with --Hall--.

Column 1, line 33, replace "hole" with --Hall--.

Column 1, line 34, replace "hole" with --Hall--.

Column 1, line 56, replace "hole" with --Hall--.

Column 1, line 59, replace "hole" with --Hall--.

Column 1, line 61, replace "hole" with --Hall--.

Column 2, line 4, replace "hole" with --Hall--.

Column 2, line 7, replace "hole" with --Hall--.

Column 2, line 8, replace "hole" with --Hall--.

Column 2, line 11, replace "hole" with --Hall--.

Column 2, line 18, replace "hole" with --Hall--.

Column 2, line 52, replace "hole" with --Hall--.

Column 2, line 57, replace "hole" with --Hall--.

Column 3, line 19, replace "hole" with --Hall--.

Column 3, line 22, replace "hole" with --Hall--.

Column 3, line 29, replace "hole" with --Hall--.

UNITED STATES PATENT AND TRADEMARK OFFICE
CERTIFICATE OF CORRECTION

| | |
|---|---|
| PATENT NO. | : 6,771,155 B2 |
| APPLICATION NO. | : 10/246598 |
| DATED | : August 3, 2004 |
| INVENTOR(S) | : Yukihiro Asa |

It is certified that error appears in the above-identified patent and that said Letters Patent is hereby corrected as shown below:

Column 3, line 31, replace "hole" with --Hall--.

Column 3, line 35, replace "hole" with --Hall--.

Column 3, line 37, replace "hole" with --Hall--.

Column 3, line 43, replace "hole" with --Hall--.

Column 3, line 52, replace "hole" with --Hall--.

Column 3, line 61, replace "hole" with --Hall--.

Column 3, line 65, replace "hole" with --Hall--.

Column 4, line 1, replace "hole" with --Hall--.

Column 4, line 3, replace "hole" with --Hall--.

Column 4, line 38, replace "hole" with --Hall--.

Column 4, line 41, replace "hole" with --Hall--.

Claim 1, column 4, line 62, replace "hole" with --Hall--.

Claim 1, column 5, line 1, replace "hole" with --Hall--.

Claim 1, column 5, line 5, replace "hole" with --Hall--.

Claim 4, column 5, line 24, replace "hole" with --Hall--.

Claim 9, column 6, line 12, replace "hole" with --Hall--.

Claim 9, column 6, line 14, replace "hole" with --Hall--.

UNITED STATES PATENT AND TRADEMARK OFFICE
CERTIFICATE OF CORRECTION

PATENT NO. : 6,771,155 B2
APPLICATION NO. : 10/246598
DATED : August 3, 2004
INVENTOR(S) : Yukihiro Asa It is certified that error appears in the above-identified patent and that said Letters Patent is hereby corrected as shown below:

Claim 9, column 6, line 20, replace "hole" with --Hall--.

Claim 9, column 6, line 22, replace "hole" with --Hall--.

Signed and Sealed this

Twenty-second Day of January, 2008

JON W. DUDAS
*Director of the United States Patent and Trademark Office*